United States Patent [19]
Usui et al.

[11] Patent Number: 5,521,403
[45] Date of Patent: May 28, 1996

[54] FIELD-EFFECT TRANSISTOR HAVING A GRADED CONTACT LAYER

[75] Inventors: Masanori Usui, Aichi-gun; Takatoshi Kato, Nisshin; Hiroyuki Kano, Nishikamo-gun; Tadashi Shibata, Toyokawa, all of Japan

[73] Assignee: Nippondenso Co., Ltd., Kariya, Japan

[21] Appl. No.: 417,894

[22] Filed: Apr. 6, 1995

[30] Foreign Application Priority Data

Apr. 7, 1994 [JP] Japan ................................. 6-095640

[51] Int. Cl.$^6$ ................... H01L 31/0328; H01L 31/0336
[52] U.S. Cl. .......................................... 257/192; 257/194
[58] Field of Search ................................ 257/192, 194, 257/611, 24, 26, 27

[56] References Cited

U.S. PATENT DOCUMENTS 5,140,386  8/1992  Huang et al. ........................... 257/192
5,428,224  6/1995  Hayashi et al. ......................... 257/192

FOREIGN PATENT DOCUMENTS 62-65378   3/1987  Japan .
5343435   12/1993  Japan .

*Primary Examiner*—Wael M. Fahmy
*Attorney, Agent, or Firm*—Cushman, Darby & Cushman

[57] ABSTRACT

A field-effect transistor includes a semi-insulating substrate, a semiconductor layer consisting of successive layers of GaAs compound semiconductor formed on the substrate, a gate electrode forming a Schottky contact with the semiconductor layer, and source and drain electrodes each forming an ohmic contact to the semiconductor layer. A semiconductor layer includes a buffer layer, an active layer, and a contact layer, where the impurity concentration in the contact layer is substantially equal to that in the active layer at the interface therewith. The impurity concentration in the contact layer increases continuously from the interface toward the upper surface of the contact layer. The field-effect transistor achieves a reduction in the ON resistance and an increase in the gate breakdown voltage at the same time, and to reduce power loss and increase efficiency.

15 Claims, 3 Drawing Sheets

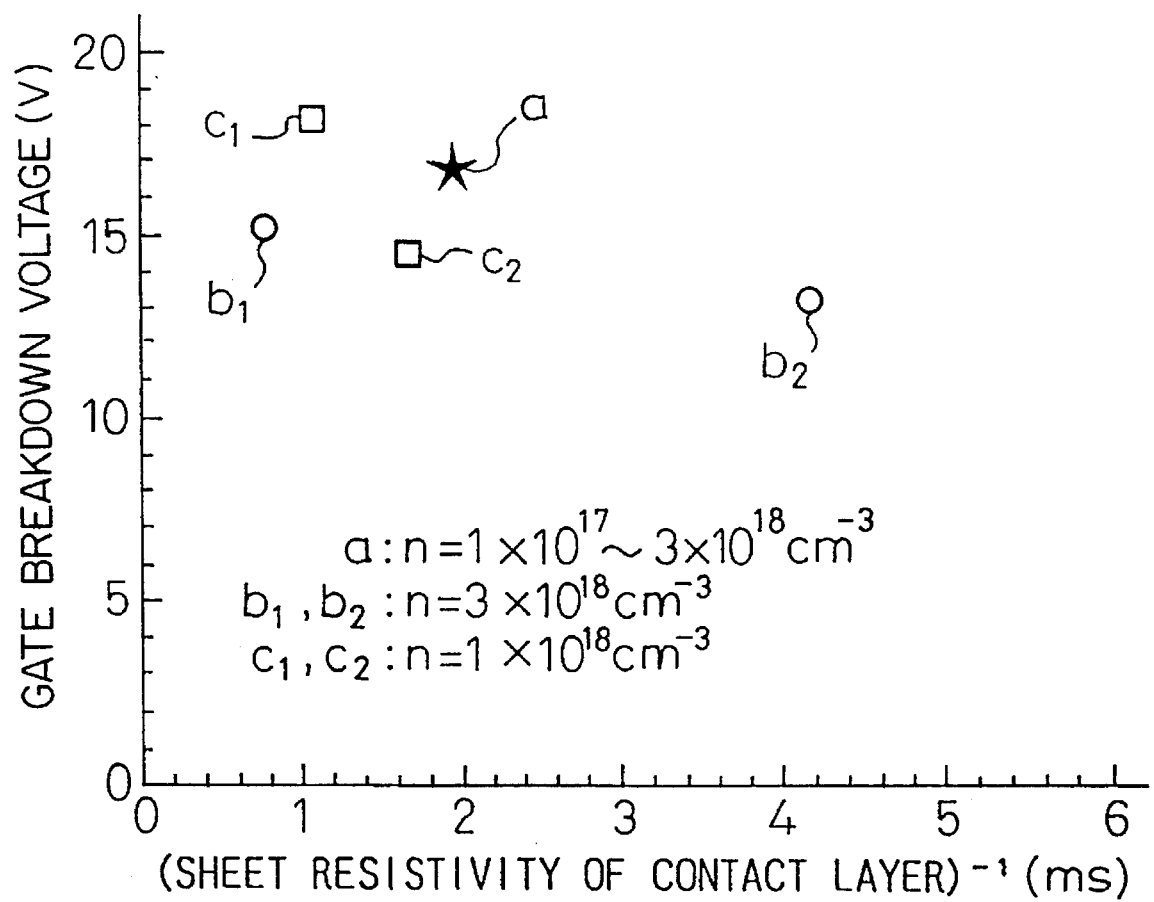

FIELD-EFFECT TRANSISTOR HAVING A GRADED CONTACT LAYER

BACKGROUND OF THE INVENTION

1. Field of the Invention

The present invention relates to a field-effect transistor and, more particularly, to a field-effect transistor such as a metal-semiconductor contact gate field-effect transistor, a p-n junction field-effect transistor, or the like, that is useful as a high-efficiency, high-frequency amplifying element.

2. Description of the Related Art

Metal-semiconductor contact gate field-effect transistors (MESFETs) fabricated from gallium arsenide (GaAs) are often used for high-frequency amplifiers because of their high-frequency performance and efficiency.

FIG. 1 shows a typical structure of a recessed-gate GaAs MESFET, for example. The GaAs MESFET 100 shown here comprises a buffer layer 12, an active layer 14, and a contact layer 16, formed successively on a semi-insulating GaAs substrate 10 using an epitaxial growth technique. The buffer layer 12 is not doped with impurities and acts as an insulating layer. The active layer 14 has a relatively low impurity concentration and forms a high-resistivity layer. On the other hand, the contact layer 16 has a higher impurity concentration than the active layer 14, and therefore forms a low-resistivity layer. The impurity concentration is controlled at a uniform level across each of the active layer 14 and the contact layer 16. A portion of the contact layer 16 is removed by etching, to form a recess 18 where a portion of the underlying active layer 14 is exposed. A gate 20 is formed on the exposed portion of the active layer 14, and the gate 20 and the active layer 14 form a Schottky contact. On the contact layer 16, a source electrode 22 and a drain electrode 24 are formed on both sides of the gate electrode 20, each forming an ohmic contact to the contact layer 16.

In the above described GaAs MESFET 100, when a positive voltage (Vds) is applied to the drain electrode 24 with respect to the source electrode 22, current flows through the active layer 14 from the drain electrode 24 to the source electrode 22. Because the gate electrode 20 and the active layer 14 form a Schottky barrier therebetween, the depth of the depletion layer can be varied by controlling the gate voltage (Vgs), as shown in FIG. 2, as a result of which the cross-sectional area of the channel varies and the drain-source current (Ids) can thus be controlled. FIG. 2 shows in schematic form the current-voltage curves for various gate voltages.

In this type of MESFET, it has been difficult to achieve a reduction in the ON resistance and an increase in the gate breakdown voltage at the same time. The reasons for this and methods for improvement will be described below.

(A) ON resistance

The ON resistance refers to the resistance between source and drain in the linear region of the drain-source voltage versus drain-source current characteristic curves shown in FIG. 2. The ON resistance Ron is expressed by the following equation (see FIG. 1).

$$Ron = Rch + 2R1 + 2R2 + 2Rco$$

where Rch is the channel resistance, R1 is the resistance of the recess, R2 is the resistance of the contact layer 16, and Rco is the ohmic contact resistance.

By reducing the ON resistance, power loss during the ON period of the MESFET can be reduced. The following two measures are effective in reducing the ON resistance.

A1: Reduce the channel resistance Rch by increasing the thickness and the doping level of the active layer.

A2: Reduce the ohmic contact resistance Rco and contact layer resistance R2 by increasing the thickness and the doping level of the contact layer.

(B) Gate breakdown voltage

When a negative voltage is applied between the gate and drain of a MESFET, the current flowing between the gate and drain suddenly begins to increase rapidly when a certain voltage is reached. The gate-drain voltage at which this phenomenon occurs is the gate breakdown voltage. This phenomenon will be explained below with reference to FIG. 3.

When the negative voltage (Vg) applied to the gate electrode 20 is increased, the depletion layer A extends from one end of the gate electrode 20 toward the drain electrode 24. When the voltage is further increased until the end of the depletion layer A reaches the interface with the contact layer 16, the depletion layer ceases to extend, and the electric field begins to concentrate at a lower end portion of the gate electrode 20. This is because the electric field is easier to form in the high-resistivity active layer 14 than in the low-resistivity contact layer. When the field density in this field concentration region B exceeds the breakdown field density of the active layer, the current flowing between the gate and drain suddenly begins to increase rapidly. The gate-drain voltage that causes this sudden increase is the gate breakdown voltage.

By increasing the gate breakdown voltage, power loss during the OFF period of the MESFET can be reduced. The following three measures are effective in increasing the gate breakdown voltage.

B1: Reduce the doping level of the active layer.

B2: Reduce the thickness and the doping level of the contact layer.

B3: Increase the recess depth.

As described above, reducing the ON resistance and increasing the gate breakdown voltage are contradicting requirements (A1 vs. B1, A2 vs. B2), and it is difficult to achieve both at the same time.

SUMMARY OF THE INVENTION

It is an object of the present invention to provide a field-effect transistor that can achieve the aforesaid contradicting requirements simultaneously, i.e. a reduction in the ON resistance and an increase in the gate breakdown voltage, that can reduce power loss within the device, and that can efficiently convert input DC power to high-frequency output power, and also to provide a method of fabricating such a field-effect transistor.

To achieve the above object, the present invention provides a field-effect transistor comprising a semi-insulating substrate, a semiconductor layer formed from a Group III–V compound semiconductor formed on the substrate and including at least an active layer and a contact layer, a gate electrode forming a Schottky contact to the active layer, and source and drain electrodes each forming an ohmic contact to the contact layer, wherein the contact layer has an impurity concentration profile such that the impurity concentration therein is substantially equal to that in the active layer at an interface therewith and increases continuously from the interface toward an upper surface of the contact layer.

The present invention also provides a method of fabricating a field-effect transistor, comprising the steps of: preparing a semi-insulating substrate; forming on the substrate a semiconductor layer consisting of successive layers of Group III–V compound semiconductor and including at least an active layer and a contact layer; forming a gate electrode which forms a Schottky contact to the semiconductor layer; forming source and drain electrodes, each forming an ohmic contact to the semiconductor layer; and in the process of forming the active layer and the contact layer successively in this order by molecular beam epitaxy, keeping the amount of impurity evaporation from an impurity molecular beam source at a constant level throughout the formation of the active layer and increasing the amount of impurity evaporation from the impurity molecular beam source with time during the formation of the contact layer.

In the field-effect transistor of the present invention, the impurity profile is made continuous at the interface between the active layer and the contact layer, eliminating an abrupt change in the impurity concentration at the contact layer/active layer interface. With this configuration, when a negative voltage is applied between the gate and drain, the depletion layer is formed extending into the contact layer. This reduces the field concentration that occurs under a lower end portion of the gate electrode, and improves the gate breakdown characteristic. Furthermore, according to the configuration of the present invention, for the same gate breakdown voltage the contact layer thickness can be increased as compared to the prior art structure, and therefore, the sheet resistance of the contact layer can be reduced, thus achieving a reduction in the ON resistance.

Accordingly, a reduction in the ON resistance and an increase in the gate breakdown voltage can be achieved at the same time, which was not possible with the prior art semiconductor device.

When the field-effect transistor of the invention is used as an amplifier, for example, power loss can be reduced and associated heat sinks and batteries can be made smaller and lighter, making it possible to reduce the size and weight of the entire amplifier construction.

BRIEF DESCRIPTION OF THE DRAWINGS

FIG. 5 is a graph showing the relationship between the gate breakdown voltage and the reciprocal of the sheet resistance of the contact layer, with results plotted for comparison between a sample prepared according to the embodiment and samples prepared for comparison.

DESCRIPTION OF THE PREFERRED EMBODIMENTS

GaAs is a representative example of the aforementioned Group III–V compound semiconductors; other Group III–V compound semiconductors that can be used include InP, InAs, AlAs, InGaAs, AlGaAs, etc.

The impurity used to dope the active layer and the contact layer is a Group II element (such as Zn, Cd, etc.) or a Group IV element (such as Si) for p type, and a Group IV element (such as Si) or a Group VI element (such as S, Se, etc.) for n type, and particularly, Si is preferable for n type.

It is required that the impurity concentration in the contact layer at the interface with the active layer be substantially equal to the impurity concentration in the active layer; more specifically, the impurity concentration in the contact layer at that interface must not differ more than ±30% from the impurity concentration in the active layer (that is, must stay within the 70 to 130 range if the impurity concentration in the active layer is 100), and it is desirable that the difference in impurity concentration be made as small as possible. A impurity concentration difference outside the ±30% range would result in a resistivity difference of about ±30% between the contact layer and the active layer. Such a large difference in resistivity would not be acceptable when considering the field concentration at the lower end of a gate that affects the gate breakdown voltage. The impurity concentration in the contact layer may increase with increasing distance from the interface with the active layer toward the upper surface of the contact layer. Though not specifically limited, it is desirable that the concentration profile be made linear, because with a linear profile, a reduction in the ON resistance and an increase in the gate breakdown voltage can be achieved effectively.

The impurity concentration in the active layer should be substantially uniform, and preferably within the range of $5 \times 10^{16}$ to $5 \times 10^{17}$ atms/cm$^3$. The impurity concentration in the contact layer should preferably be within the range of $5 \times 10^{16}$ to $5 \times 10^{17}$ atms/cm$^3$ near the interface with the active layer, and within the range of $1 \times 10^{18}$ to $1 \times 10^{19}$ atms/cm$^3$ near the upper surface.

The present invention is useful in that the current used to energize and heat the impurity molecular beam source to remove the impurity atoms is kept at a constant level throughout the formation of the active layer and is gradually increased with time during the formation of the contact layer.

EXAMPLE

Figure 1:
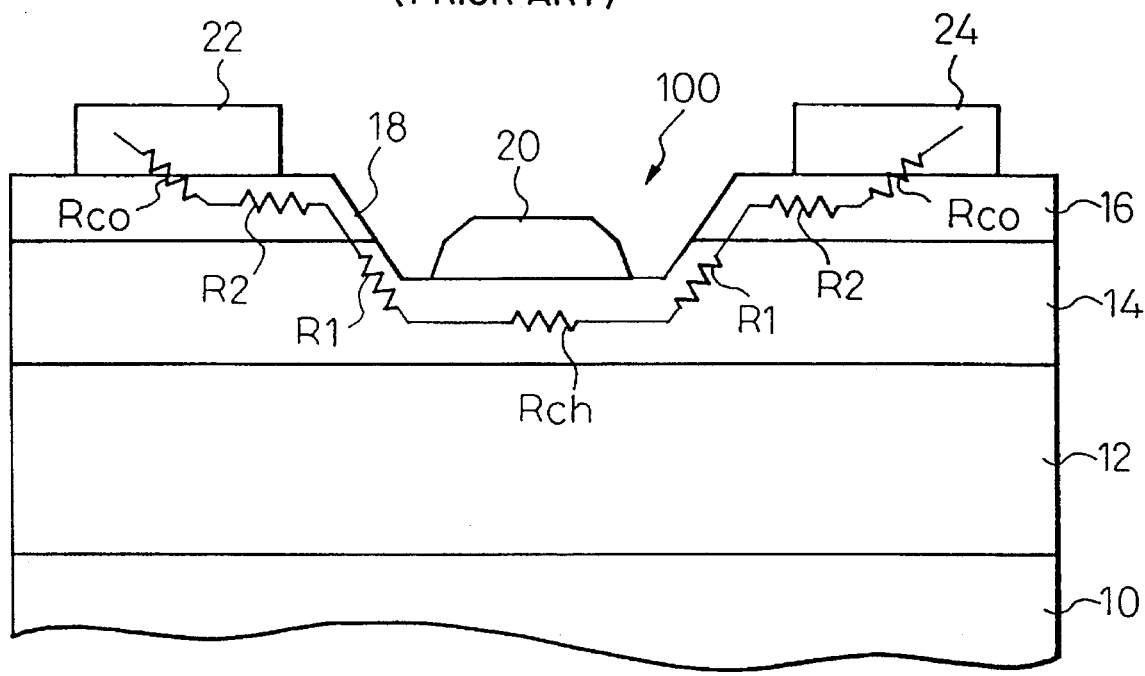
FIG. 1 is a cross-sectional view showing the typical structure of a recessed-gate MESFET.
Figure 2:
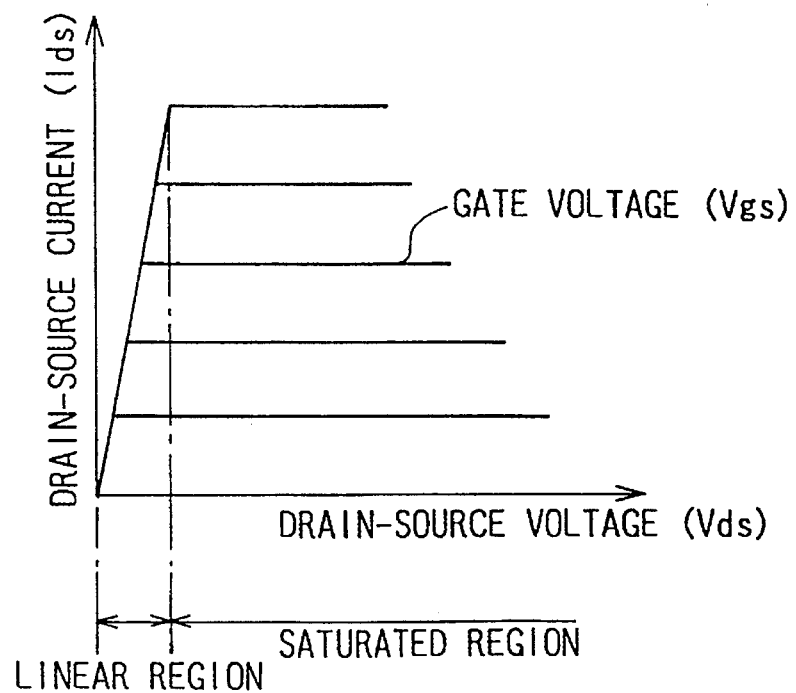
FIG. 2 is a graph showing the relationship between drain-source voltage and drain-source current for various gate voltages applied to the MESFET shown in FIG. 1.
Figure 3:
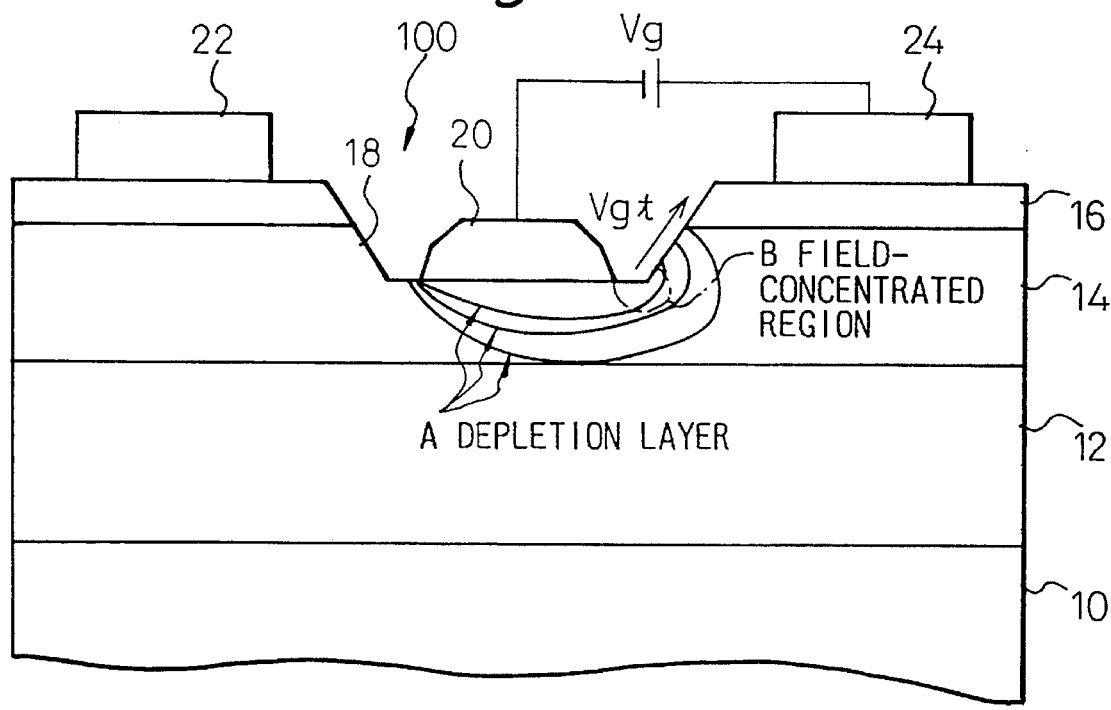
FIG. 3 is a cross-sectional view schematically showing the occurrence of field concentration in the MESFET of the prior art.

A preferred embodiment of the MESFET embodying the present invention will now be described in detail below. The description will be given with reference to FIG. 1 since the basic physical structure is the same as that of the semiconductor device shown in FIG. 1.

The GaAs MESFET 100 is fabricated by successively forming a buffer layer 12, an active layer 14, and a contact layer 16 on a semi-insulating GaAs substrate 10 by using an epitaxial growth technique such as molecular beam epitaxy (MBE). The buffer layer 12, formed to a thickness of 0.1 to 1.0 μm, is not doped with impurities and acts as an insulating layer. The active layer 14, formed to a thickness of 0.05 to 1.0 μm, is doped with impurity (silicon, zinc, etc.) with a concentration of $5 \times 10^{16}$ to $5 \times 10^{17}$ atms/cm$^3$. The contact layer 16, formed to a thickness of 0.01 to 1.0 μm, is doped with impurity (silicon, zinc, etc.) with a concentration of $5 \times 10^{17}$ to $1 \times 10^{19}$ atms/cm$^3$.

Preferably, the impurity concentration in the active layer 14 should be made uniform throughout. The contact layer 16 should have an impurity concentration substantially equal to that in the active layer 14 at the interface therewith, the difference being held preferably within the ±30% range of the impurity concentration in the active layer 14, and more preferably within a ±3% range. The impurity concentration in the contact layer 16 is made to increase continuously from the interface toward the upper surface, reaching $5 \times 10^{18}$ to $1 \times 10^{19}$ atms/cm$^3$ at the upper surface.

The gate electrode 20, the source electrode 22, and the drain electrode 24 are the same as those of the previously described semiconductor device, and therefore, their detailed descriptions will not be given here.

(Working example)

The relationship between the sheet resistance and gate breakdown voltage of the contact layer was obtained to confirm the electrical properties of the semiconductor device of the above embodiment. The results are shown in FIG. 5, where the reciprocal of the sheet resistance of the contact layer is plotted along the abscissa, and the gate breakdown voltage along the ordinate.

(1) Samples

Embodiment sample (one kind)

Active layer

Impurity concentration (uniform): $1 \times 10^{17}$ atms/cm$^3$

Thickness: 0.45 μm

Dopant: Silicon

Contact layer

Impurity concentration: $1 \times 10^{17}$ atms/cm$^3$ (at interface) to $3 \times 10^{18}$ atms/cm$^3$ (at upper surface)

Thickness: 0.05 μm

Dopant: Silicon

Figure 4:
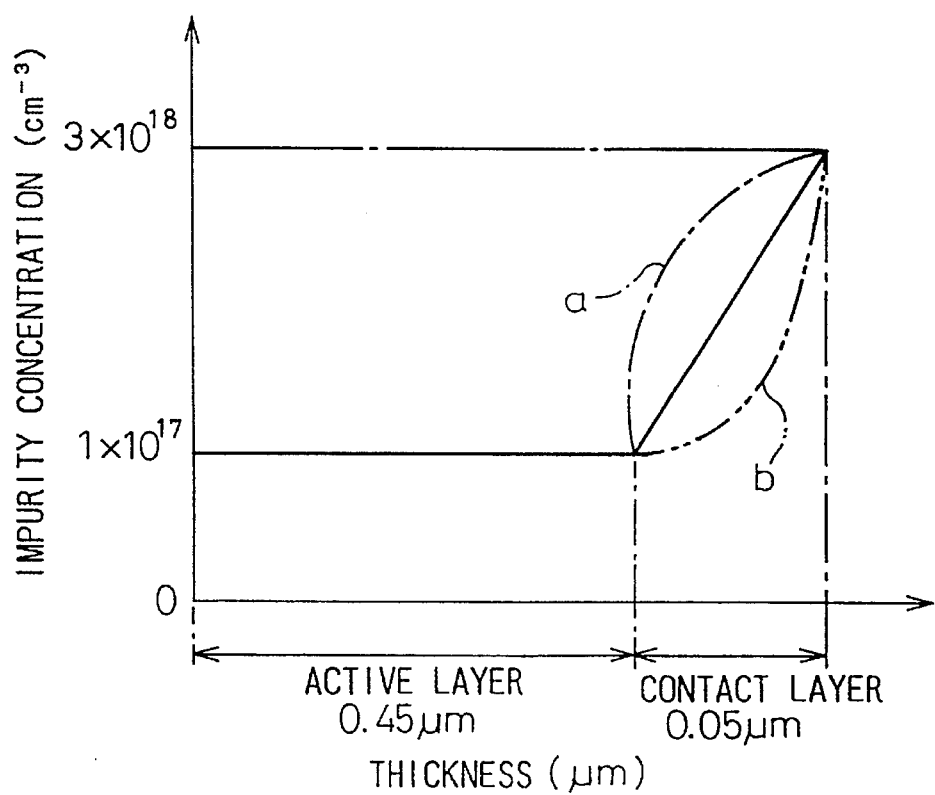
FIG. 4 is a graph showing the impurity profiles of an active layer and a contact layer in one embodiment of the present invention.

FIG. 4 shows the impurity profiles of the active layer and the contact layer. In this sample, the doping level of the active layer is constant, while that of the contact layer varies linearly.

Comparison sample 1 (two kinds)

Active layer

Same as the embodiment sample

Contact layer

Impurity concentration: $1 \times 10^{18}$ atms/cm$^3$

Thickness: 0.01 μm, 0.05 μm

Dopant: Silicon

Comparison sample 2 (two kinds)

Active layer

Same as the embodiment sample

Contact layer

Impurity concentration: $3 \times 10^{18}$ atms/cm$^3$

Thickness: 0.01 μm, 0.05 μm

Dopant: Silicon

In each of the embodiment sample and comparison samples 1 and 2, the gate length is 0.5 μm, the gate width is 150 μm, and the thickness of the active layer under the gate electrode is 0.25 μm. The gate electrode 20 is formed from a metal film of three-layered structure of Ti/Pt/Au (thickness 0.05/0.05/0.2 μm). Likewise, the source electrode 22 and the drain electrode 24 are each formed from a metal film of three-layered structure of AuGe/Ni/Au (thickness 0.05/0.015/0.2 μm).

(2) Method of measurement

A negative voltage was applied to the gate electrode with respect to the source electrode, and the gate-source voltage at which the gate-source current reached 10 μA was obtained. This voltage was measured as the gate breakdown voltage.

(3) Results

In FIG. 5, a shows the result for the embodiment sample, b1 and b2 the results for the comparison sample 1, and c1 and c2 the results for the comparison sample 2; b1 and c1 are for the samples with a contact layer thickness of 0.01 μm and b2 and c2 are for the samples with a contact layer thickness of 0.05 μm.

From the results for the comparison sample 1 (b1, b2) or comparison sample 2 (c1, c2), it can be seen that with the same impurity concentration, as the thickness is increased, the sheet resistance decreases but the gate breakdown voltage also decreases. On the other hand, when the embodiment example (a) is compared with the comparison samples (b2, c2), it is shown that the embodiment sample has a sheet resistance larger than the comparison sample b2 but smaller than the comparison sample c2, and a gate breakdown voltage larger than either of the comparison samples. This confirms that the semiconductor device of the above embodiment can achieve a reduction in the ON resistance and an increase in the gate breakdown voltage at the same time.

In the above embodiment sample, the impurity concentration in the contact layer is varied linearly in the depth direction, but this is not restrictive. For example, the impurity concentration profile may be varied in a curved fashion as shown by a curve a or b in FIG. 4.

The invention has been described as being embodied in a recessed-gate MESFET, but it will be appreciated that the invention is not limited to the illustrated type, but can also be applied to other types of semiconductor devices, such as a recessed-gate HEMT (high electron mobility transistor), a p-n junction FET, etc.

According to the invention, since the impurity concentration in the contact layer is made substantially equal to that of the active layer at the interface therewith and is made to increase continuously from the interface toward the upper surface, it is possible to achieve a reduction in the ON resistance and an increase in the gate breakdown voltage at the same time. The invention can thus provide a low-dissipation, high-efficiency field-effect transistor.

We claim:

1. A field-effect transistor comprising:

a semi-insulating substrate, a semiconductor layer consisting of successive layers of Group III–V compound semiconductor material formed on said substrate and including at least an active layer and a contact layer, a gate electrode forming a Schottky contact to said active layer of said semiconductor layer, and source and drain electrodes each forming an ohmic contact to said contact layer of said semiconductor layer, wherein said contact layer has an impurity concentration profile such that the impurity concentration in said contact layer is substantially equal to an impurity concentration in said active layer at an interface of said active and contact layers, said impurity concentration in said contact layer increasing continuously from said interface toward an upper surface of said contact layer.

2. A field-effect transistor according to claim 1, wherein said Group III–V compound semiconductor material is selected from the group consisting of GaAs, InP, InAs, AlAs, InGaAs, and AlGaAs.

3. A field-effect transistor according to claim 1, wherein the impurity concentration in said contact layer at said interface differs by no more than ±30% from the impurity concentration in said active layer.

4. A field-effect transistor according to claim 1, wherein the impurity concentration in said contact layer at said interface differs by no more than ±3% from the impurity concentration in said active layer.

5. A field-effect transistor according to claim 1, wherein the impurity concentration in said contact layer increases linearly from the interface with said active layer to the upper surface of said contact layer.

6. A field-effect transistor according to claim 1, wherein the impurity concentration in said active layer is substantially uniform across said active layer and within the range of $5 \times 10^{16}$ to $5 \times 10^{17}$ atoms/cm$^3$.

7. A field-effect transistor according to claim 1, wherein the impurity concentration in said contact layer is within the range $5 \times 10^{16}$ to $5 \times 10^{17}$ atoms/cm$^3$ near the interface with said active layer and within the range of $1 \times 10^{18}$ to $1 \times 10^{19}$ atoms/cm$^3$ near the upper surface of said contact layer.

8. A field-effect transistor according to claim 1, further comprising a buffer layer formed between said substrate and said active layer, wherein the thickness of said buffer layer is 0.1 to 1.0 µm.

9. A field-effect transistor according to claim 1, wherein the thickness of said active layer is 0.05 to 1.0 µm.

10. A field-effect transistor according to claim 1, wherein the thickness of said contact layer is 0.01 to 1.0 µm.

11. A field-effect transistor according to claim 1, wherein said gate electrode is formed on said active layer and exposed in a recess formed in said contact layer.

12. A field-effect transistor according to claim 1, wherein the impurity used to dope said active layer and said contact layer is a Group II element for a p type transistor.

13. A field-effect transistor according to claim 1, wherein the impurity used to dope said active layer and said contact layer is a Group IV element for a p type transistor.

14. A field-effect transistor according to claim 1, wherein the impurity used to dope said active layer and said contact layer is a Group IV element for an n type transistor.

15. A field-effect transistor according to claim 1, wherein the impurity used to dope said active layer and said contact layer is a Group VI element for an n type transistor.

\* \* \* \* \*